July 29, 1969 T. CAFARELLA ET AL 3,458,819
UHF-IF OR VHF-IF CONVERTER
Filed Oct. 5, 1966

United States Patent Office 3,458,819

Patented July 29, 1969

3,458,819

UHF-IF OR VHF-IF CONVERTER

Thomas Cafarella, Forest Hills, and Carmine F. Vasile, Greenlawn, N.Y., assignors to Hazeltine Research Inc., a corporation of Illinois Filed Oct. 5, 1966, Ser. No. 584,465
Int. Cl. H04b 1/26, 1/28, 1/06
U.S. Cl. 325—438 8 Claims

ABSTRACT OF THE DISCLOSURE

A single stage transistor mixer circuit capable of two modes of operation. In the first mode of operation the transistor operates in a common base configuration to convert UHF signals to IF signals; in the second mode of operation the transistor operates in a common emitter configuration to convert VHF signals to IF signals.

Figure 1:
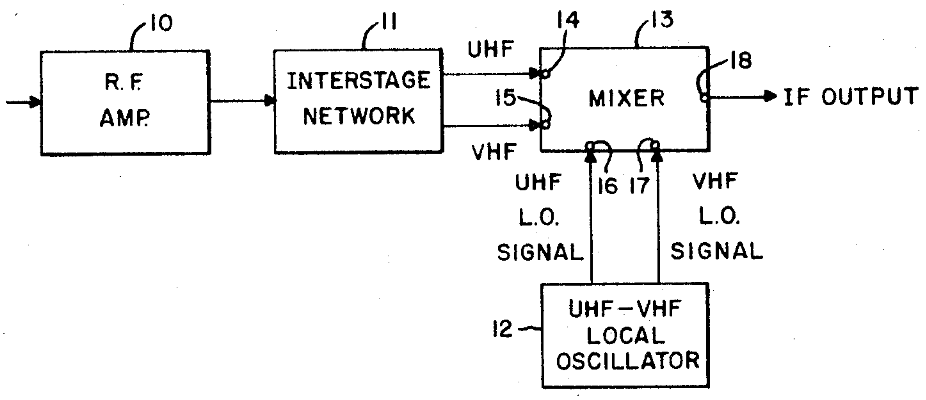

The present invention relates generally to mixer circuits, and more particularly to mixer circuits operable over both a high frequency band and a lower frequency band with equal facility.

Mixer circuits for converting a band of radio frequencies (RF) to a corresponding band of intermediate frequencies (IF) are well known, and can be found, for example, in both the UHF and VHF tuners of prior all-channel television receivers. In the VHF tuner, a mixer circuit is used to convert the radio frequencies associated with each received VHF television channel to a common IF band. In the UHF tuner a separate and additional mixer circuit is used to convert the radio frequencies associated with each received UHF television channel to the IF band. The IF output of the UHF tuner is then fed to an input of the VHF tuner, which serves to provide additional amplification during UHF reception.

Recently, efforts have been underway to develop a combined UHF-VHF television tuner utilizing only a single RF-IF signal processing channel wherein both UHF and VHF radio frequencies would be converted directly to intermediate frequencies, instead of using the more expensive two-step conversion process described above, which requires two separate processing channels having redundant components (i.e.: two separate mixers and local oscillators). However, such a single RF-IF processing channel requires a single mixer circuit capable of converting both the radio frequencies in the high UHF band and those in the lower VHF band to frequencies in the common IF band. Until the advent of the present invention suitable mixer circuits capable of performing this function were not available.

It is therefore an object of the present invention to provide a simple mixer circuit capable of two modes of operation, wherein in a first mode, high frequency signals are converted to intermediate frequencies and wherein in a second mode lower frequency signals are converted to intermediate frequencies.

It is another object of the present invention to provide a single stage transistor mixer which operates in a common base configuration when converting high UHF frequencies to IF and operates in a common emitter configuration when converting lower VHF frequencies to IF.

In accordance with the present invention a mixer circuit capable of two modes of operation wherein in a first mode high frequency signals are converted to intermediate frequencies and wherein in a second mode lower frequency signals are converted to intermediate frequencies, comprises an electron device having a first electrode to which are supplied a high frequency reference signal and high frequency information signals during the first mode of operation and a second electrode to which are supplied a lower frequency reference signal and lower frequency information signals during the second mode of operation, means connected between the second electrode and a source of reference potential for providing a relatively low impedance coupling therebetween for high frequencies and a relatively high impedance coupling therebetween for lower frequencies, and means connected between the first electrode and the source of reference potential for providing a relatively high impedance coupling therebetween for high frequencies and a relatively low impedance coupling therebetween for lower frequencies whereby during the first mode of operation, when the high frequency reference signal and the high frequency information signals are supplied to the first electrode, the high frequency information signals are converted to intermediate frequencies by the electron device, and during the second mode of operation when the lower frequency reference signal and the lower frequency information signals are supplied to the second electrode, the lower frequency information signals are converted to intermediate frequencies by the electron device.

For a better understanding of the present invention together with other and further objects thereof, reference is had to the following description taken in connection with the accompanying drawing, and its scope will be pointed out in the appended claims.

Figure 2:
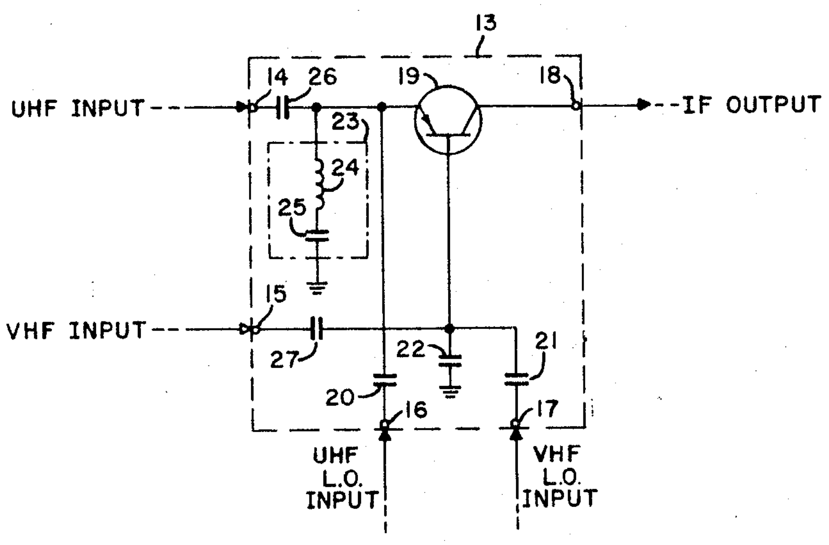

Referring to the drawing:

FIG. 1 is a block diagram illustrating the environment in which mixer circuits embodying the present invention may be used, and FIG. 2 is a schematic diagram of a mixer circuit which embodies the present invention in one form.

Description of the invention

The block diagram of FIG. 1 illustrates generally the environment in which a mixer circuit 13 constructed in accordance with the present invention can be used in an RF to IF signal conversion chain. The particular block diagram of FIG. 1 illustrates, in this instance, part of the signal conversion chain of a combined UHF-VHF television tuner. In the block diagram of FIG. 1, RF amplifies both UHF and VHF radio frequencies and supplies them to an interstage coupling network 11, wherein the high UHF frequency band and the lower VHF frequency band are separated and each is separately supplied to one of the two input terminals 14 and 15 of mixer circuit 13. In this case the high UHF radio frequencies are supplied to input terminal 14 and the lower VHF radio frequencies are supplied to input terminal 15 of mixer 13. Additionally, local oscillator (L.O.) 12 supplies either a UHF L.O. signal or a VHF L.O. signal to the input terminal 16 or 17, respectively, of mixer 13. An oscillator suitable for use as the L.O. 12 is fully disclosed in Patent 3,401,356, which issued Sept. 10, 1968, and entitled "Tunable Oscillator Circuits." During UHF reception, UHF radio frequencies supplied to input terminal 14 and the UHF L.O. signal supplied to input terminal 16 of mixer 13 are mixed and the resulting intermediate frequencies presented at the output terminal 18 of mixer 13. Likewise, during VHF reception, VHF radio frequencies supplied to input terminal 15 and a VHF L.O. signal supplied to input terminal 17 of mixer 13 are mixed and the resulting intermediate frequencies presented at the output terminal of mixer 13.

In FIG. 2 there is shown a typical embodiment of a mixer circuit 13 constructed in accordance with the present invention and suitable for use in the signal conversion chain of FIG. 1. In the embodiment of FIG. 2, mixer circuit 13 includes an electron device having first, second and third electrodes, which in this case is a conventional PNP transistor 19 wherein the first, second and third electrodes are its emitter, base and collector electrodes, respectively. Supplied to the emitter of transistor 19 during a first mode of operation are a high frequency reference signal and high frequency information signals, in this case a UHF L.O. signal and UHF radio frequency signals, respectively. The UHF L.O. signal is supplied via input terminal 16 and coupling capacitor 20, while the UHF radio frequency signals are supplied via input terminal 14 and coupling capacitor 26. Supplied to the base of transistor 19 during a second mode of operation are a lower frequency reference signal and lower frequency information signals, which in this case are a VHF L.O. signal and VHF radio frequency signals, respectively. The VHF L.O. signal is supplied via input terminal 17 and coupling capacitor 21, while the VHF radio frequency signals are supplied via input terminal 15 and coupling capacitor 27.

Mixer 13 further includes means connected between the base of transistor 19 and a source of reference potential, in this case ground, for providing a relatively low impedance coupling therebetween for high frequencies and a relatively high impedance coupling therebetween for lower frequencies. In the embodiment of FIG. 2 this means consists of capacitor 22 connected between the base of transistor 19 and ground. The value of capacitor 22 is selected so as to present a relatively low impedance for the high UHF frequencies, including the UHF L.O. signal, and a relatively high impedance for the lower VHF frequencies, including the VHF L.O. signal. In this manner, the base of transistor 19 is coupled to ground through a low impedance for UHF frequencies, including the UHF L.O. signal, but is effectively isolated from ground for the lower VHF frequencies, including the VHF L.O. signal.

Also included in mixer 13 is means connected between the emitter of transistor 19 and ground for providing a relatively high impedance coupling therebetween for high UHF frequencies, including the UHF L.O. signal, and a relatively low impedance coupling therebetween for lower VHF frequencies, including the VHF L.O. signal. In the embodiment of FIG. 2 this means consists of the components within dotted box 23, which in this case are an inductor 24 and capacitor 25 connected in series between the emitter of transistor 19 and ground. The values of inductor 24 and capacitor 25 are selected such that the series combination has a large C/L ratio and is resonant at the approximate center of the IF band, which in the present case is adjacent the lower end of the VHF frequency band. Hence, for IF, VHF and VHF L.O. frequencies the L-C combination of components 24 and 25 will present a relatively low impedance path between the emitter of transistor 19 and ground, while at the higher UHF and UHF L.O. frequencies, this series L-C combination will present a relatively high impedance, effectively isolating the emitter of transistor 19 from ground at UHF.

Operation of the circuit of FIG. 2

The simple mixer circuit of FIG. 2 is capable of two separate modes of operation, and the switchover from one mode to another is achieved automatically. The first mode of operation will be considered to occur during reception of a UHF television signal when a local oscillator supplies a UHF L.O. signal to input terminal 16, and UHF radio frequencies corresponding to a received UHF television channel are supplied to input terminal 14 of the mixer of FIG. 2. During this first mode of operation UHF radio frequencies are supplied via coupling capacitor 26 to the emitter of transistor 19. Likewise, a UHF L.O. signal is supplied via coupling capacitor 20 to the emitter of transistor 19. Since series resonant circuit 23 is designed to resonate within the IF band, circuit 23 will present a relatively high impedance at UHF, thereby effectively serving as an RF choke between the emitter of transistor 19 and ground for UHF. Since capacitor 22 is chosen to present a relatively low impedance for UHF, the base of transistor 19 is coupled to ground via this relatively low impedance during this first mode of operation. Hence, it can be seen that since the emitter of transistor 19 is effectively isolated from ground by the series resonant circuit 23 for UHF, and since the base of transistor 19 is effectively coupled to ground through the low impedance presented by capacitor 22, the circuit of FIG. 2 functions in a common base configuration for UHF during this firse mode of operation. The UHF radio frequencies and the UHF L.O. signal are mixed within transistor 19, thus converting the UHF radio frequencies to a band of intermediate frequencies, which intermediate frequency signals appear at the collector electrode of transistor 19 and are presented at output terminal 18 of mixer 13 as the resulting IF output signal.

The second mode of operation for the mixer circuit of FIG. 2 is considered as occurring during VHF reception when VHF radio frequencies corresponding to a received VHF television channel are supplied to input terminal 15, and when a VHF L.O. signal is supplied to input terminal 17 of the mixer. During this second mode of operation, the VHF radio frequencies are supplied to the base of transistor 19 via coupling capacitor 27, while the VHF L.O. signal is also supplied to the base of transistor 19 via coupling capacitor 21. As was mentioned previously, bypass capacitor 22 is chosen to present a relatively high impedance for VHF and VHF L.O. frequencies, thereby isolating the base of transistor 19 from ground for VHF, while the series resonant circuit 23 is designed to present a relatively low impedance for VHF and VHF L.O. frequencies, thereby providing a low impedance path between the emitter of transistor 19 and ground during this second mode of operation. Therefore, it will be seen that during VHF operation the mixer circuit of FIG. 2 functions in a common emitter configuration, since capacitor 22 effectively isolates the base from ground, while series resonant circuit 23 provides a low impedance path to ground from the emitter. The VHF radio frequencies and the VHF L.O. signal are mixed within transistor 19, thus converting the VHF radio frequencies to a band of intermediate frequencies, which intermediate frequency signals appear at the collector electrode of transistor 19 and are presented at the output terminal 18 of mixer circuit 13 as the resulting IF output signal.

It will be noted that the switchover from common base operation during UHF reception to common emitter operation during VHF reception is automatic, and depends only upon having the proper signals supplied to the emitter and base electrodes, as described hereinabove.

The embodiment of FIG. 2 is particularly advantageous since it is recognized generally that in transistorized mixer circuits, a better noise figure is obtained for UHF operation if the transistor operates in a common base configuration, while the opposite is true for VHF operation. That is, a better noise figure is obtained for VHF operation if the transistor operates in a common emitter configuration. Additionally, in the present instance, IF amplification occurs during both modes of operation, since as far as the intermediate frequencies are concerned, the transistor always appears to be in a common emitter configuration. This results due to the fact that the IF band in a conventional television receiver is adjacent the lower end of the VHF band, so that capacitor 22 presents a relatively high impedance to ground for IF signals, while the resonant circuit 23 presents a relatively low impedance to ground for the IF signals.

While the following component values have been found to provide satisfactory performances in the mixer circuit of FIG. 2, these values are provided merely as examples, and are not intended to limit the invention in any manner.

| | | |
|---|---|---|
| Transistor 19 | | Siemens AF139 |
| Capacitor 20 | μμf | 0.5 |
| Capacitor 21 | μμf | 4.0 |
| Capacitor 22 | μμf | 47.0 |
| Capacitor 26 | μμf | 0.5 |
| Capacitor 27 | μμf | 18.0 |
| Series Resonant Circuit 23: | | |
| Inductor 24 | μh | 0.05 |
| Capacitor 25 | μμf | 250 |
| Resonant frequency | mHz | 45 |
| UHF RF input range | mHz | 470–890 |
| VHF RF input range | mHz | 54–217 |
| UHF L.O. input range | mHz | 517–937 |
| VHF L.O. input range | mHz | 101–264 |
| IF frequency range | mHz | 40–50 |

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A mixer circuit capable of two modes of operation wherein in a first mode high frequency signals are converted to intermediate frequencies and wherein in a second mode lower frequency signals are converted to intermediate frequencies, comprising:

an electron device having a first electrode to which are supplied a high frequency reference signal and high frequency information signals during said first mode of operation and a second electrode to which are supplied a lower frequency reference signal and lower frequency information signals during said second mode of operation;

means connected between said second electrode and a source of reference potential for providing a relatively low impedance coupling therebetween for high frequencies and a relatively high impedance coupling therebetween for lower frequencies;

and means connected between said first electrode and said source of reference potential for providing a relatively high impedance coupling therebetween for high frequencies and a relatively low impedance coupling therebetween for lower frequencies;

whereby, during said first mode of operation, when said high frequency reference signal and said high frequency information signals are supplied to said first electrode, said high frequency information signals are converted to intermediate frequencies by said electron device, and during said second mode of operation when said lower frequency reference signal and said lower frequency information signals are supplied to said second electrode, said lower frequency information signals are converted to intermediate frequencies by said electron device.

2. A mixer circuit in accordance with claim 1 wherein the means connected between said second electrode and a source of reference potential is a capacitor and wherein said source of reference potential is ground.

3. A mixer circuit in accordance with claim 1 wherein the means connected between said first electrode and said reference potential is a series resonant circuit and wherein said source of reference potential is ground.

4. A mixer circuit in accordance with claim 3 wherein said series resonant circuit is resonant at a selected lower frequency.

5. A mixer circuit in accordance with claim 3 wherein said series resonant circuit is resonant at a selected intermediate frequency.

6. A mixer circuit in accordance with claim 3 wherein said electron device is a transistor and said first and second electrodes are the emitter and base electrodes respectively of said transistor, and intermediate frequency signals are made available at the collector electrode of said transistor.

7. A mixer circuit for a UHF-VHF television receiver, wherein in a first mode of operation UHF radio frequency signals are converted to intermediate frequencies and wherein in a second mode of operation VHF radio frequency signals are converted to intermediate frequencies, comprising:

a transistor having an emitter electrode to which is supplied a UHF local oscillator signal and UHF radio frequency signals corresponding to a received UHF television channel during said first mode of operation, and having a base electrode to which is supplied a VHF local oscillator signal and VHF radio frequencies corresponding to a received VHF television channel during said second mode of operation;

a capacitor connected between said base electrode and ground for providing a relatively low impedance coupling therebetween for UHF frequencies and a relatively high impedance coupling therebetween for VHF frequencies;

and a series resonant circuit connected between said emitter electrode and ground for providing a relatively high impedance coupling therebetween for UHF frequencies and a relatively low impedance coupling therebetween for lower VHF frequencies;

whereby, during said first mode of operation, when said UHF local oscillator signal and said UHF radio frequency signals are supplied to said emitter electrode, said UHF radio frequency signals are converted to intermediate frequencies, and during said second mode of operation, when said VHF local oscillator signal and said lower VHF radio frequency signals are supplied to said base electrode, said VHF radio frequency signals are converted to intermediate frequencies by said electron device.

8. A mixer circuit in accordance with claim 7 wherein said series resonant circuit is resonant at a selected intermediate frequency, wherein during said first mode of operation said UHF radio frequency signals are converted to intermediate frequencies and amplified by said electron device, and wherein during said second mode of operation said VHF radio frequency signals are converted to intermediate frequencies and amplified by said electron device.

References Cited

UNITED STATES PATENTS 3,314,011 4/1967 Bachnick ---------- 325—459

KATHLEEN H. CLAFFY, Primary Examiner

CHARLES JIRAUCH, Assistant Examiner

U.S. Cl. X.R.

325—443, 451, 461